United States Patent [19]

Lee et al.

[11] Patent Number: 5,608,257

[45] Date of Patent: Mar. 4, 1997

[54] FUSE ELEMENT FOR EFFECTIVE LASER BLOW IN AN INTEGRATED CIRCUIT DEVICE

[75] Inventors: Pei-Ing P. Lee, Lagrangeville; Frank Prein, Wappingers Falls, both of N.Y.

[73] Assignee: International Business Machines Corporation, Armonk, N.Y.

[21] Appl. No.: 477,060

[22] Filed: Jun. 7, 1995

[51] Int. Cl.[6] .............................. H01L 27/10; H01L 29/00
[52] U.S. Cl. .......................... 257/529; 257/208; 257/209; 257/528
[58] Field of Search ................................... 257/529, 208, 257/209, 528

[56] References Cited

U.S. PATENT DOCUMENTS

| | | | |
|---|---|---|---|
| 4,198,744 | 4/1980 | Nicolay | 29/623 |
| 4,665,295 | 5/1987 | McDavid | 219/121 LM |
| 4,682,204 | 7/1987 | Shiozaki et al. | 357/51 |
| 4,826,785 | 5/1989 | McClure et al. | 437/174 |
| 4,853,758 | 8/1989 | Fischer | 357/51 |
| 4,935,801 | 6/1990 | McClure et al. | 357/51 |
| 5,260,597 | 11/1993 | Orbach et al. | 257/529 |
| 5,279,984 | 1/1994 | Kinoshita et al. | 437/52 |
| 5,321,300 | 6/1994 | Usuda et al. | 257/529 |

Primary Examiner—Mahshid D. Saadat
Assistant Examiner—Valencia Martin Wallace
Attorney, Agent, or Firm—H. Daniel Schnurmann

[57] ABSTRACT

In an integrated circuit having interconnecting lines formed on an insulated layer deposited on a semiconductor substrate which provide connections between elements integral to the integrated circuit, a fuse structure programmable by a laser beam that includes: a melt-away elongated fuse link joining two segments of an interconnecting line; a plurality of fins integral and coplanar to the fuse link, each of the fins transversally extending away from the fuse link for absorbing energy emitted by the laser beam; and a reflecting plate positioned underneath the fuse link to reflect energy provided by the laser beam back into the fuse link, such that both the combination of the fins and the reflecting plate reduces the energy emitted by the laser beam required to blow the fuse structure.

20 Claims, 4 Drawing Sheets

5,608,257

FUSE ELEMENT FOR EFFECTIVE LASER BLOW IN AN INTEGRATED CIRCUIT DEVICE

FIELD OF THE INVENTION

This invention relates to a fuse element used in an integrated circuit device, and more particularly to the construction of a fuse link to be melted away by a laser.

BACKGROUND OF THE INVENTION

Fuses are routinely used in the design of monolithic integrated circuits (IC), and in particular in memory devices as elements for altering the configuration of the circuitry contained therein. As such, memories are commonly built with programmed capabilities wherein fuses are selectively "blown" by, e.g., a laser beam.

It is also well known that random access memories (RAM) are designed with redundancies which include spare columns or rows or even fully functional arrays, wherein when any of these spare elements fails, the defective row, column, and the like are replaced by a corresponding element. Disabling and enabling spare elements is accomplished by fuses which are strategically placed throughout the IC and which are blown (i.e., melted away) when required, preferably, by the laser beam.

Additionally, the technique of laser fuse deleting (trimming) has been widely used both in memory and logic IC fabrication industry, as an effective way to improve functional yields and to reduce development cycle time. Yet, fuse blow yield and fuse reliability have been problematic in most conventional fuse designs.

Fuse elements are routinely built of aluminum, copper, polysilicon, silicide or any high conductive metal or alloy. Generally, two ends of a conductive line are joined by a neck, of a width considerably smaller than that of the conductive lines, so as to require less energy to zap the connection. Practitioners of the art will fully appreciate that a plurality of such fuses may be placed side by side. As such, by requiring less energy to zap one of the fuses, less likelyhood exists that damage may be caused on an adjoinig fuse or a circuit element placed nearby.

Various configurations of such fuse elements have been described. In U.S. Pat. No. 4,682,204 to Shiozaki et al., a fuse element prepared from, for instance, polycrystalline silicon, is deposited on an insulated substrate. The connecting portions are integrally formed at both ends of the fuse link. Each of the connecting portions includes a plurality of stepped sections contacting a corresponding stepped section formed on the insulated substrate. In this manner, by increasing the heat capacity of the connecting portions, the fuse link requires less area, thereby decreasing the overall surface required by the fuse structure.

In another embodiment, described in U.S. Pat. No. 4,198,744, to Nicholay, a suspended fuse element including a first metallic layer on an insulation layer deposited on a substrate, is followed by the formation of a fusible material, wherein the material is selectively removed to define the fuse element having a neck portion. This process has the distinct advantage of lowering the thermal conductivity of the fuse link, thereby lessening the amount of energy required to blow it.

In yet another embodiment described in U.S. Pat. No. 5,321,300 to Usuda et al., a laser-broken fuse is formed on an interlevel insulating film. A polisilicon-made heat member is provided in the interlevel film underneath the fuse link. The heat member is placed on an insulated field. This member generates heat by absorbing energy from the laser beam and thermally explodes, breaking the fuse link.

In addition to optimizing the dimensions of the fuse link to lower the energy required to program a fuse, it has been found advantageous to place a shield-plate under the fuse structure to avert damaging adjoining areas of an IC.

Such an arrangement is described, e.g., in U.S. Pat. No. 5,279,984, to Konoshita, et al., wherein at least a portion of the shield plate is placed directly below the fuse element. Appropriate care needs to be taken to ensure that field shield plate is not short-circuited even when a laser beam is irradiated with a deviation for severing the fuse link. The shield-plate described by Konoshita is preferably made of polysilicon or of an equivalent material, which in its nature, absorbs much of the energy provided by the laser. Practitioners of the art will fully appreciate that in addition to the shielding properties obtained by placing a shield underneath the fuse, it would be far more advantageous to reduce the amount of laser energy required to blow the fuse to minimize the damage which potentially could be caused to other elements within the IC.

Referring to FIG. 1, the top view of a conventional fuse structure is shown with two ends of a conductive line 10, respectively attached to a fuse link 20. Also shown is the optimal position of laser spot 15. The energy transmitted by the laser is lost in the area enclosed by the spot, and only a fraction of the total energy is absorbed by the fuse link 20. As a result, the amount of energy to zap the fuse is considerably higher than that required if most of the energy could somehow be channeled to the fuse link.

FIG. 1 also illustrates a conventional fuse design interacting with a single pulse laser. Normally, a straight fuse link 20 is lined-up in a fuse bank. In special situations, a dummy fuse 18 is inserted between two adjoining fuses to achieve better planarization. The dummy fuse 18 is typically placed in the center of the open spaces between two active fuses. The dummy fuse is nothing more than a section of interconnection within the fuse bank, but electrically segregated from other fuses in the bank. Regardless as to whether the fuse is active or a dummy, conventional fuse designs do not usually achieve their intended purpose, i.e., of achieving optimal fuse blow efficiency. The laser energy distribution can be described by either a Gaussian or a rectangular spatial distribution. Indeed, a conventional fuse typically only occupies one-third or less of the area covered by the laser. Even with a highly coherent laser beam, two thirds or more of the laser energy pulse is still required to couple sufficient energy into the active fuse in order to blow it. More specifically, near 70% of the laser energy is transmitted or reflected in the area not covered by the fuse link 20. Even in the 30% remaining area that is covered by the fuse link, 20–60% of the energy is either reflected or transmitted due to multilayer interference effect. Thus, only 12–24% of the total energy is actually used for zapping the fuse. As a result, substantial damage to the substrate can easily occur on areas not covered by the fuses, due to the high rate of absorption and high percentage of laser transmitted, in addition to the higher amount of laser energy that is required to zap the fuse link.

Practitioners of the art will fully appreciate that the width of a fuse cannot be arbitrarily increased. Consistency between the material used and the energy expended to achieve melting of the fuse link must be maintained. Clearly, a link that is too wide may require too high level of energy which may be injurious to the remaining elements forming the IC. On the other hand, too little energy may be insufficient to blow the link and explode the protective layer of oxide.

OBJECTS OF THE INVENTION

It is, therefore, an object of the present invention to provide a fuse structure having a fuse link with an optimum geometry so as to minimize the energy required to zap the fuse.

It is another object to place a reflector underneath the fuse link capable of "bouncing back" a substantial portion of the laser energy.

It is yet another object to provide a fuse element having a "patterned" design to improve the absorption efficiency of the laser.

It is still another object to include a "patterned" reflector which can be created by CMP (chemical-mechanical polishing) and which provides focus to the reflected beam, thereby improving the fuse efficiency.

It is a further object to introduce a slight curvature in the reflecting structure that is instrumental in making it more tolerant to laser misalignment and which helps concentrate the reflections from the laser directly onto the fuse link.

It is yet a further object to optimize the geometry and configuration of a fuse element used in memories, both SRAMs and DRAMs, and in particular, in 16 Mb and 64 Mb DRAMs.

SUMMARY OF THE INVENTION

The foregoing problems are overcome and the objects of the invention are realized by a fuse structure with an optimized geometry and by minimizing the amount of laser energy required to blow the fuse.

In accordance with the invention, in an integrated circuit having interconnecting lines formed on an insulated layer deposited on a semiconductor substrate providing connections between elements integral to the integrated circuit, there is provided a fuse structure programmable by a laser beam, comprising: a melt-away elongated metal fuse link connecting two segments of an interconnection line; fins integral and coplanar to the fuse link and transversally extending from the fuse link for absorbing energy emitted by the laser beam; and a reflecting plate positioned underneath said fuse link, for reflecting energy provided by the laser beam back into the fuse link, wherein the fins and the reflecting plate reduce the energy emitted by the laser beam required to blow the fuse structure.

Briefly, the fuse structure of the present invention is characterized in that the laser rate of energy absorption is maximized for a predetermined spatial distribution of the laser energy. Thus, the mass of the fuse material (that define both its thickness and area) that is covered by the laser spot will be maximized. Moreover, the mass of fuse material should in no way be higher than the mass that can be vaporized by a conventional amount of laser energy (typically, a fraction of 0.3 uj to 1.2 uj).

Furthermore, the mass of fuse material is confined to a specific location to allow for laser misalignments (i.e., of the order of 1 um). Finally, the mass of fuse material is distributed to ensure and maintain planarity within the IC device.

BRIEF DESCRIPTION OF THE DRAWINGS

The present invention will be understood and appreciated more fully from the following detailed description, taken in conjunction with the drawings, in which.

DETAILED DESCRIPTION OF THE INVENTION

Figure 1:
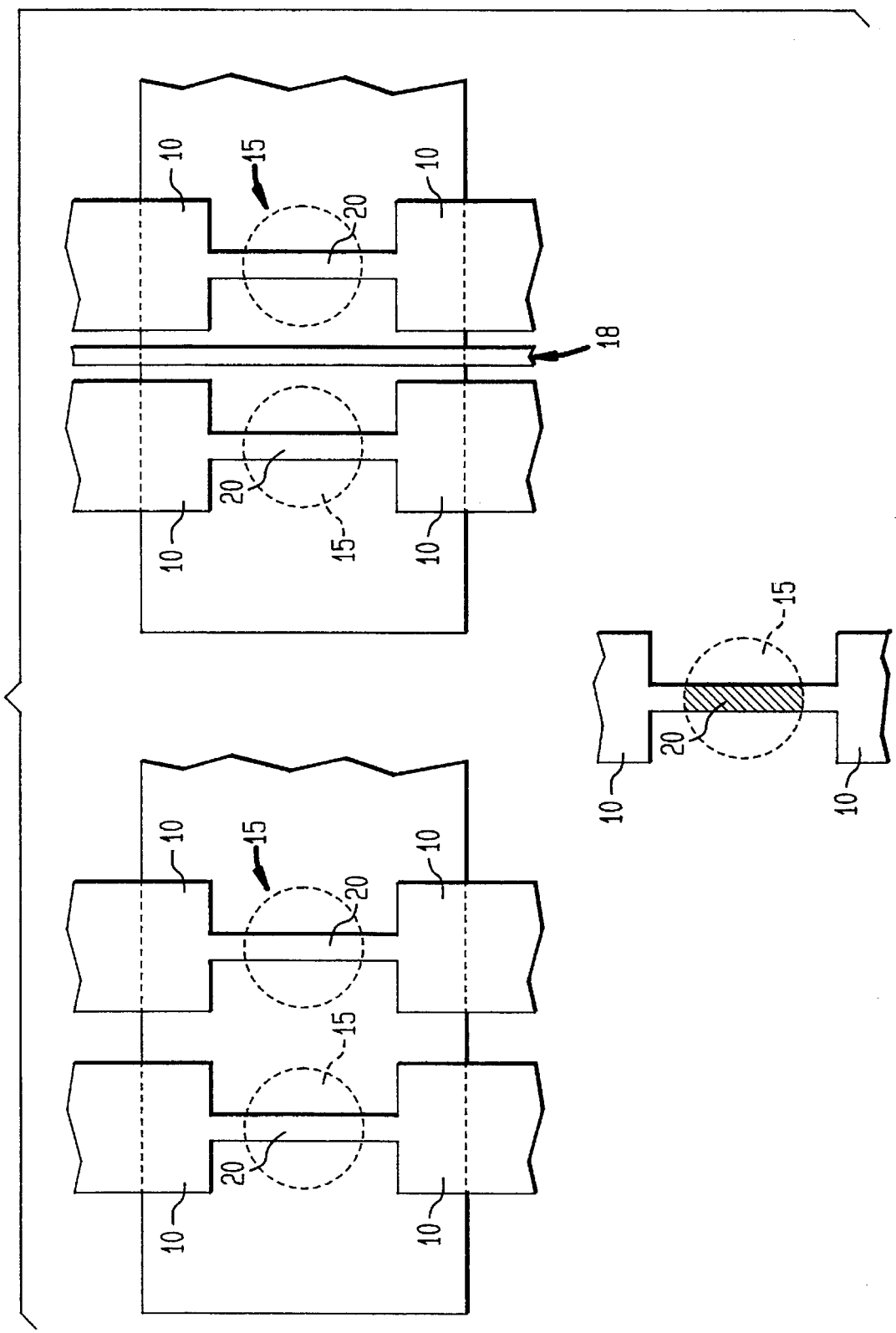
FIG. 1 illustrates a topographical view of a prior art fuse element.
Figure 2A:
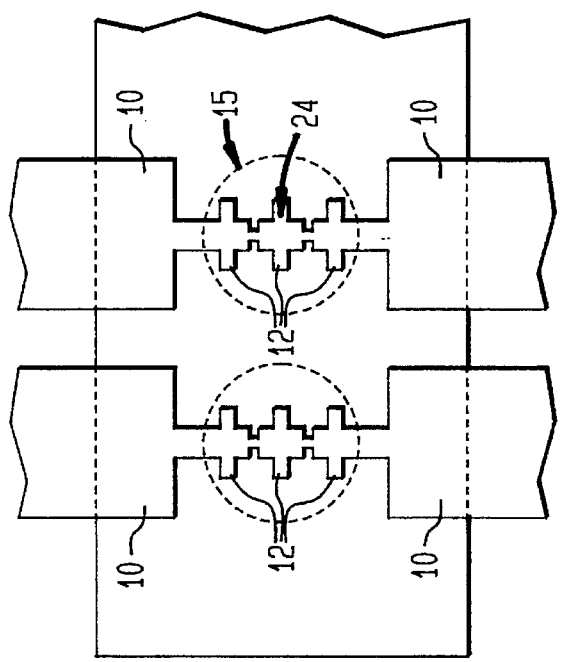
FIGS. 2a–2d is a view of the fuse structure according to the present invention, wherein the fuse link is shown having short and long fins protruding from the trunk of the fuse link.
Figure 2B:
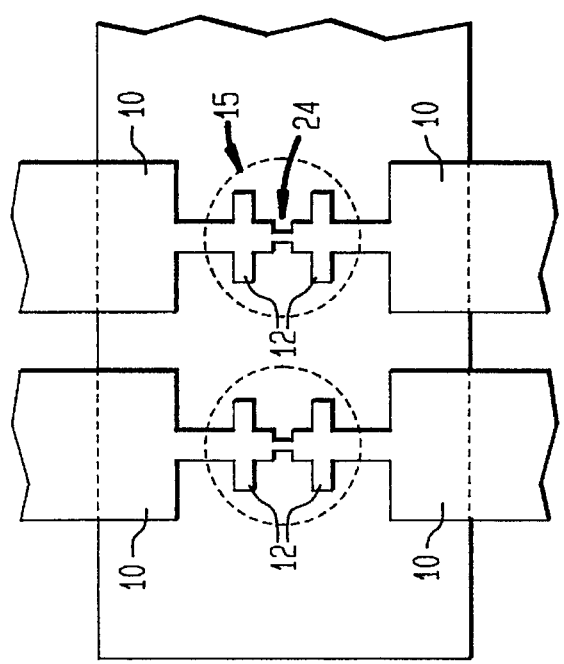
Figure 2C:
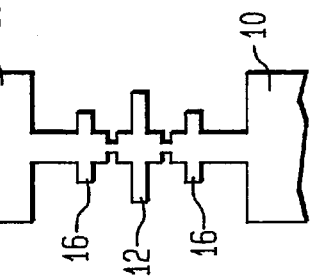
Figure 2D:
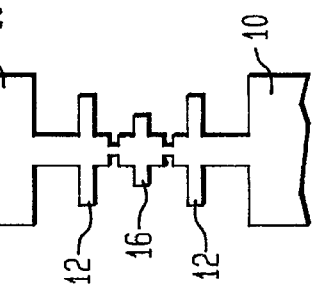

A fuse structure with the desired characteristics is shown with reference to FIGS. 2a–2d. A fuse link having a narrow neck 24, modified to include a series of fins 12 protruding from the neck of the fuse are shown. These fins allow for a higher level of energy absorption than that offered by the conventional fuse link illustrated in FIG. 1. The main requirement governing the length of the fins is that it meet the requirements imposed by laser misalignment tolerances and any process planarization groundrules. Thus, a combination of long and short fins (12 and 16, respectively) may be used. Additionally, it would be advantageous that there be an optimized laser absorption in view of the spatial laser energy distribution.

It is, thus, important that the space between fins be set as close as possible to the laser wavelength. This, in turn, allows for the transmitted laser beam to be diffracted which, in turn, permits more absorption from the sidewall of the fin and also reduces the transmitted energy between the fins, which is an important source of damage to the substrate. The length and width of the narrower stripe in the middle is that it allows for a more effective deletion process. Instead of the single crater that is created by a conventional fuse design, a double, triple or even multiple crater (or subcrater) can effectively be blown by a single laser pulse. The object, though, is to increase the redundancy to a single crater. Moreover, the overall resistance of blown fuses increases since a series of multiple resistors can be created.

Figure 3B:
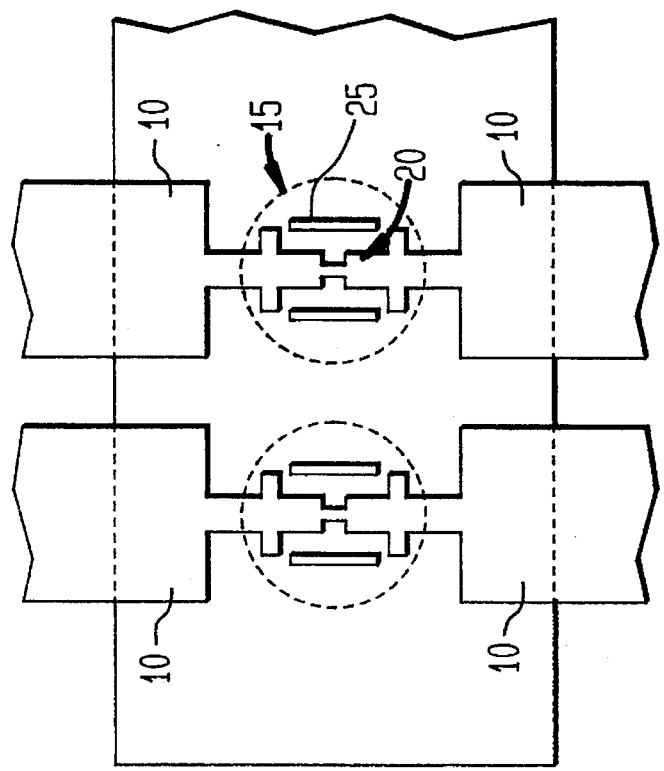
FIGS. 3a–3b show another embodiment of the present invention, wherein dummy fuses are incorporated into the fuse link.
Figure 3A:
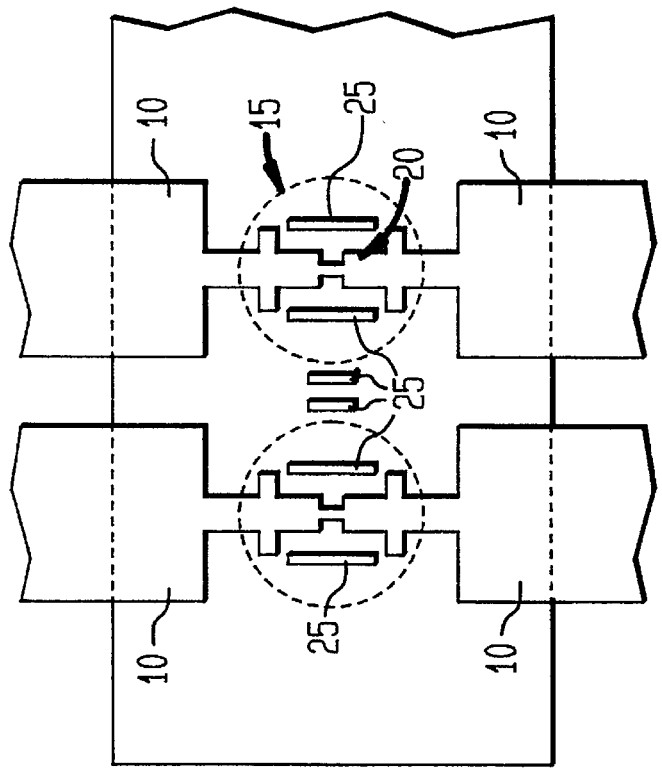

In another embodiment of the present invention, shown in FIG. 3, two or more narrow pieces of dummy fuses 25 are placed adjacent to the active fuses. The fins (12 and 16) serve a similar purpose to the one previously described. The dummy fuses 25 are left floating electrically, such that even in the case when the dummy fuse is accidentally blown due to a laser misalignment, a minimum effect on the active fuses can be expected. Consequently, the utilization of dummy fuses can tolerate higher misalignements, if it were needed.

The embodiments hereby described are deemed to achieve a more efficient distribution of the laser energy, and additionally, pave the way for a more effective scattering of the laser energy and an increased absorption on the fuse side walls. By introducing redundancies within the fuse structure, a plurality of craters or sub-craters are achieved with one single laser burst of energy.

Figure 4:
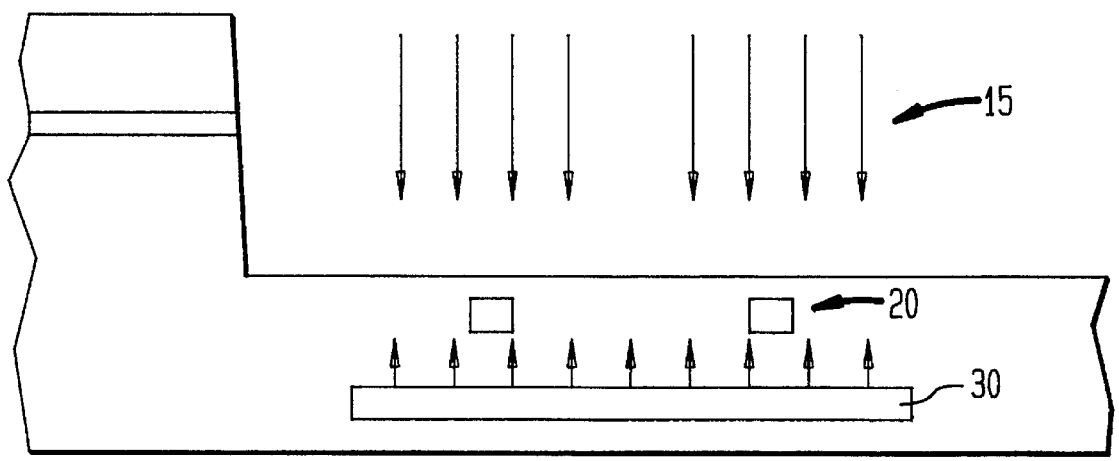
FIG. 4 is a cross-section view of the fuse structure according to the present invention, wherein a reflective structure is placed underneath the fuse link.

Referring now to FIG. 4, there is shown a reflective structure 30 underneath the fuse link. The reflective structure, in the shape of a circle, a plate or a grid, is constructed using the previous layer beneath the fuse link. The plate is most advantageously made of a conductive material, such as aluminum or any reflective material and is patterned using reactive-ion-etch (RIE), chemical-mechanical polish (CMP) or lift-off process. A flat large plate is suggested for a vertical reflection.

Figure 5:
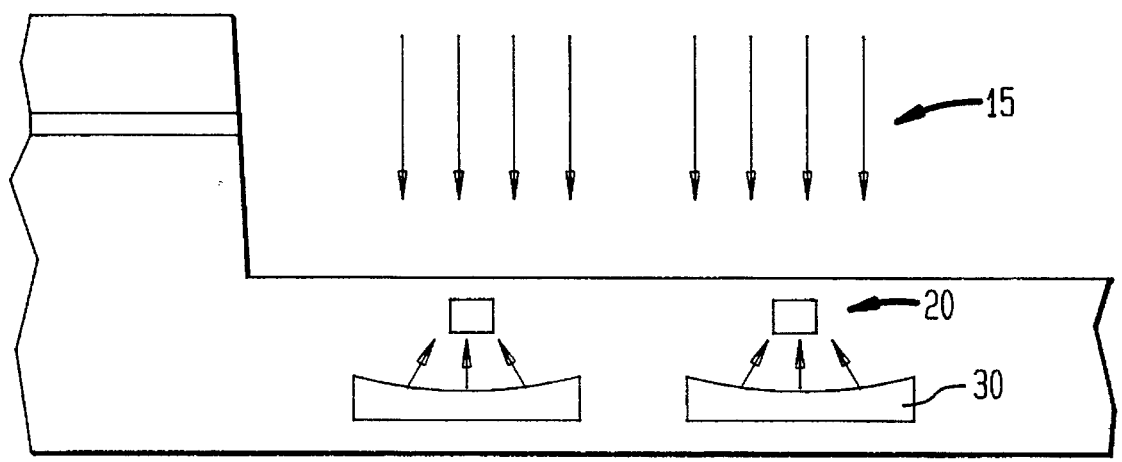
FIG. 5 shows a cross-section of the fuse link having a curved reflective shield to concentrate the reflected laser beam directly onto the fuse link.

In another embodiment of the reflective structure, shown in FIG. 5, the plate 30 is provided with curvature to take full advantage of the focusing effect of the laser beam. Such a curvature can be obtained by means of CMP reflow aluminum or by a CMP collimated aluminum. This focusing effect from the curvature not only improves the absorption of the fuse link but also acts as a self-aligning feature capable of handling misalignment problems. Practitioners of the art will readily appreciate that other patterning reflective structures could alternately be used to improve the laser absorption, to shield the elements within the IC and to improve the focusing efficiency of the laser beam.

While the invention has been particularly shown and described with reference to several embodiments, it will be understood by those skilled in the art that various changes in form and detail may be made therein without departing from the scope and spirit of the invention.

What is claimed is:

1. In an integrated circuit having a plurality of interconnection lines providing connections between elements integral to the integrated circuit, a fuse structure programmable by a laser beam, comprising:

a melt-away elongated fuse link connecting two segments of one of said interconnection lines; and at least one fin integral and coplanar to the fuse link and transversely extending from the fuse link, wherein said fuse link, said at least one fin, and said two segments of one of said interconnection lines are formed of the same layer.

2. The fuse structure as recited in claim 1, wherein a plurality of said at least one fin divides said fuse link into fuse link sections.

3. The fuse structure as recited in claim 2, wherein the width of at least one of said fuse link sections is narrower than the width of said fuse link.

4. The fuse structure as recited in claim 1, wherein said at least one fin extends in a direction perpendicular to said fuse link.

5. The fuse structure as recited in claim 1, further comprising at least one dummy fuse link positioned in close proximity to said fuse link but electrically isolated from said fuse link.

6. The fuse structure as recited in claim 1, further comprising a reflecting plate positioned underneath said fuse link, for reflecting energy provided by said laser beam.

7. The fuse structure as recited in claim 1, wherein said fuse link and said at least one fin are made of a high conductivity metal.

8. The fuse structure as recited in claim 7, wherein said high conductivity metal is selected from the group that includes aluminum, copper, polysilicon, silicide and alloys therefrom.

9. In an integrated circuit having interconnecting lines providing connections between elements integral to the integrated circuit, a fuse structure programmable by a laser beam, comprising:

a melt away elongated fuse link joining two segments of an interconnecting line;

a plurality of fins integral and coplanar to the fuse link, each of said fins transversely extending from the fuse link and;

a reflecting plate positioned underneath said fuse link, for reflecting energy provided by the laser beam back into the fuse link, wherein said fins and said reflecting plate reduce the energy emitted by the laser beam required to blow the fuse structure, wherein said fuse link, each of said fins, and said two segments of one of said interconnection lines are formed of the same layer.

10. The fuse structure as recited in claim 9, wherein a plurality of said fins divide said fuse link into fuse link sections.

11. The fuse structure as recited in claim 9, wherein the width of at least one of said fuse link sections is narrower than the width of said fuse link.

12. The fuse structure as recited in claim 9, wherein said at least one fin extends in a direction perpendicular to said fuse link.

13. The fuse structure as recited in claim 9, further comprising at least one dummy fuse link positioned in close proximity to said fuse link but electrically isolated from said fuse link.

14. The fuse structure as recited in claim 9, wherein said fuse link and said at least one fin are made of a high conductivity metal.

15. The fuse structure as recited in claim 14, wherein said high conductivity metal is selected from the group that includes aluminum, copper, polysilicon, silicide and alloys therefrom.

16. The fuse structure as recited in claim 9, wherein said reflective plate is a concave upper surface, thereby focusing the reflected beam into the fuse link.

17. The fuse structure as recited in claim 9, wherein said reflective plate is a flat plate.

18. The fuse structure as recited in claim 9, wherein said reflective plate is made using a chemical-mechanical polish process.

19. The fuse structure as recited in claim 9, wherein said reflective plate is made using a reactive-ion-etch process.

20. The fuse structure as recited in claim 9, wherein said reflective plate is made using a lift-off process.

* * * * *

UNITED STATES PATENT AND TRADEMARK OFFICE
CERTIFICATE OF CORRECTION

PATENT NO. : 5,608,257
DATED : March 4, 1997
INVENTOR(S) : Pei-Ing P. Lee and Frank Prein It is certified that error appears in the above-indentified patent and that said Letters Patent is hereby corrected as shown below:

On Title Page, Column 1, after "Corporation, Armonk, N.Y."

please insert:

-- [73] Assignee: Siemens Aktiengesellschaft
Munich, Germany --

Signed and Sealed this

Tenth Day of June, 1997

Attest:

BRUCE LEHMAN

*Attesting Officer*   Commissioner of Patents and Trademarks